United States Patent [19]
Mikome

[11] 4,384,345
[45] May 17, 1983

[54] READ-ONLY MEMORY DEVICE

[75] Inventor: Koichi Mikome, Kawasaki, Japan

[73] Assignee: Fujitsu Limited, Kawasaki, Japan

[21] Appl. No.: 261,878

[22] Filed: May 8, 1981

[30] Foreign Application Priority Data

May 9, 1980 [JP] Japan .................................. 55/61296

[51] Int. Cl.$^3$ ............................................ G11C 11/40
[52] U.S. Cl. ..................................... 365/104; 365/94; 357/45
[58] Field of Search ................... 365/94, 96, 100, 103, 365/104; 357/45

[56] References Cited

U.S. PATENT DOCUMENTS

3,665,426  5/1972  Gross et al. ..................... 365/174
3,983,544  9/1976  Dennison et al. ................ 365/174
4,129,936 12/1978  Takei .............................. 29/571

OTHER PUBLICATIONS

Electronics, vol. 52, No. 15, Jul. 19, 1979, "Single-Chip Computer Scrambles for Security", by R. Budzinski, pp. 140–144.

IBM Tech. Dis. Bul., vol. 15, No. 8, Jan. 1973, "Read-Only Memory Fabrication by Laser Formed Connections", by P. W. Cook et al., pp. 2371–2372.

*Primary Examiner*—Terrell W. Fears
*Attorney, Agent, or Firm*—Staas & Halsey

[57] ABSTRACT

A read-only memory device comprising first and second memory cell areas is disclosed. In the first memory cell area, the presence or absence of a transistor represents the binary data "0" or "1", while, in the second memory cell area, the presence or absence of a connection for connecting a transistor to one of bit lines represents the binary data "0" or "1".

9 Claims, 17 Drawing Figures

READ-ONLY MEMORY DEVICE

BACKGROUND OF THE INVENTION

The present invention relates to a read-only memory (ROM) device and, more particularly, to a ROM device incorporated in a one-chip microcomputer.

In recent years, a one-chip microcomputer has been successfully developed. In such a one-chip microcomputer, a user program is incorporated in the form of a mask ROM. In this ROM device, programming of the data pattern is fixed during the manufacture thereof and, in addition, the data pattern cannot be changed during operation. Therefore, the data pattern may be determined prior to the manufacture of such a read-only memory device; strictly speaking, the data pattern must be determined prior to the manufacturing step for forming the data pattern on a chip.

The manufacture of such a mask ROM device should be able: to reduce the cell area of the ROM device occupied on a chip as much as possible in order to enhance the integration density thereof; and to reduce the turn-around time, that is, the time-period from the time when a user orders the content of the ROM device to the time when the user obtains the one-chip microcomputer incorporating a desired ROM.

There have been various types of mask ROM devices; however, the following systems are representative:

(a) A system in which the binary data "0" or "1" of a memory cell corresponds to the presence or absence of an enhancement type transistor at each intersection between word lines and bit lines (hereinafter, referred to as an F system);

(b) A system in which the binary data "0" or "1" of a memory cell corresponds to the high or low level of the threshold voltage of an enhancement type transistor at each intersection between the word lines and the bit lines (hereinafter referred to as a Ci-A-system);

(c) A system in which the binary data "0" or "1" of a memory cell corresponds to the enhancement type or depletion type of a transistor at each intersection between the word lines and the bit lines (hereinafter, referred to as a Ci-B system); and (d) A system in which the binary data "0" or "1" of a memory cell corresponds to the presence or absence of a contact window which connects one of the bit lines to a transistor at each intersection between the word lines and the bit lines (hereinafter referred to as an N system).

The above-mentioned ROM systems have the following characteristics:

| System | Cell Area | Turn-around Time |
|---|---|---|
| F system | Small | Long |
| Ci-A system | Small | Medium |
| Ci-B system | Small | Medium |
| N system | Large | Short |

That is, with regard to the characteristic of the cell area, the F, Ci-A and Ci-B systems are advantageous, while, with regard to the characteristic of the turn-around time, the N system is advantageous.

SUMMARY OF THE INVENTION

It is a principal object of the present invention to provide a read-only memory device with a relatively small cell area without increasing the turn-around time.

According to the present invention, there is provided a read-only memory device include first and second power supplies, a plurality of first word lines and a plurality of bit lines crossed with the first word lines and the second word lines and connected to the first power supply. The read-only memory device also includes a first memory cell area comprising first memory cells at intersections between the first word lines and the bit lines, each first memory cell having a first transistor in accordance with the binary data "0" or "1", wherein the presence or absence of the first transistor represents the binary data "0" or "1". The device further includes a second memory cell area comprising second memory cells at intersections between the second word lines and the bit lines, each second memory cell having a second transistor, wherein the presence or absence of a connection for connecting the second transistor to one of the bit lines represents the binary data "0" or "1". In this ROM device, a first information, which is basically not changed for various conditions, is written in the first memory cell area by using the above-mentioned F or Ci-A system, while, a second information, which may be changed often for various conditions, is written on the second memory cell area by using the above-mentioned N system. In this case, for example, the first information includes a main program, unchangeable subroutine programs and the like, while, the second information includes changeable subroutine programs, constants used in the afore-mentioned programs and the like.

The present invention will be more clearly understood from the description as set forth below contrasting the present invention with the conventional devices and with reference to the accompanying drawings.

DESCRIPTION OF THE PREFERRED EMBODIMENTS

Figure 1A:
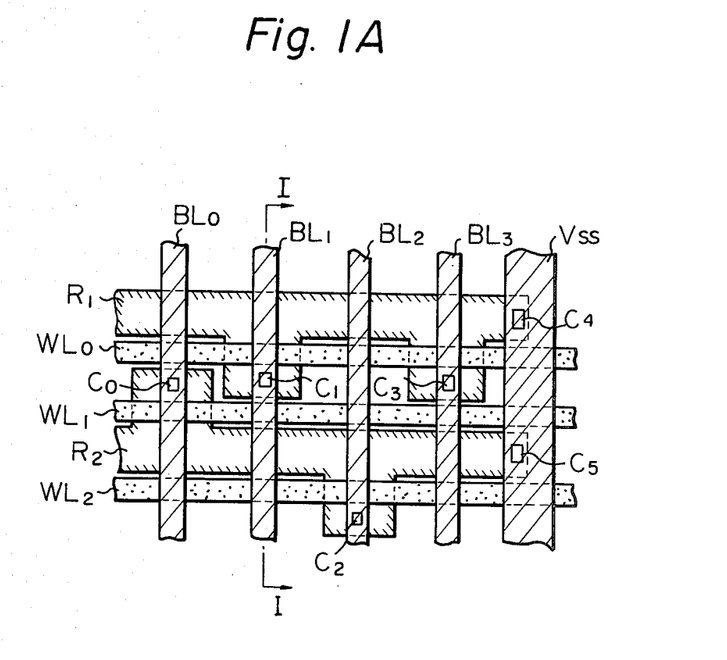
FIGS. 1A, 2A, 3A and 4A are plan views illustrating first, second, third and fourth conventional ROM devices by using the F system, the Ci-A system, the Ci-B system and the N system, respectively.

In FIG. 1A, which illustrates a first conventional ROM device made by using the F system, $WL_0$, $WL_1$ and $WL_2$ are word lines which are made of, for example, polycrystalline silicon; $BL_0$, $BL_1$, $BL_2$ and $BL_3$ are bit lines which are made of, for example, aluminium; $V_{ss}$ is a power supply line which is also made of aluminium; and $R_1$ and $R_2$ are n+ type impurity regions. In this case, a substrate 1 which is shown not in FIG. 1A, but is shown in FIG. 1B, is p− type monocrystalline silicon.

In FIG. 1A, the data pattern is determined by an <F> mask for defining the impurity regions $R_1$ and $R_2$ and an <N> mask for defining contact windows $C_0$, $C_1$, $C_2$ and $C_3$. In this case, the <N> mask is also used for defining contact windows $C_4$ and $C_5$ which connect the power supply line $V_{ss}$ to the impurity regions $R_1$ and $R_2$, respectively.

Figure 1B:
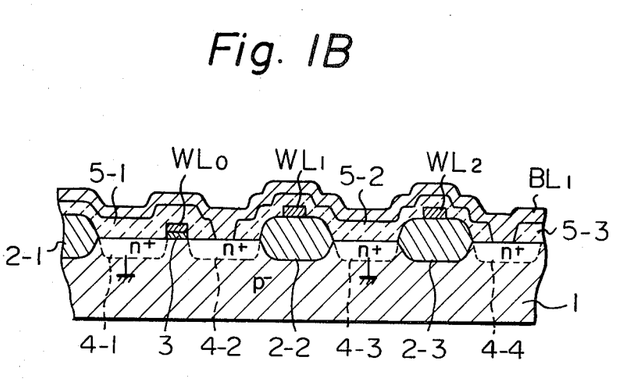
FIGS. 1B, 2B, 3B and 4B are cross-sectional views taken along the lines I—I of FIG. 1A, the lines II—II of FIG. 2A, the lines III—III of FIG. 3A and the lines IV—IV of FIG. 4A, respectively.

FIG. 1B is a cross-sectional view taken along the lines I—I of FIG. 1A. As illustrated in FIG. 1B, thick oxide ($SiO_2$) layers 2-1, 2-2 and 2-3 are formed by thermally oxidizing the substrate 1 and in addition, a thin oxide ($SiO_2$) layer 3 is formed by thermally oxidizing the substrate 1. The word lines $WL_0$, $WL_1$ and $WL_2$ are deposited on the thin oxide layer 3, the thick oxide layers 2-2 and 2-3, respectively, so that a transistor is formed at the intersection between the word line $WL_0$ and the bit line $BL_1$, while no transistors are formed at the intersections between the word lines $WL_1$, $WL_2$ an the bit line $BL_1$. Note that reference numerals 5-1, 5-2 and 5-3 are insulating layers for isolating the word lines $WL_0$, $WL_1$ and $WL_2$ and the bit line $BL_1$, which layers are made of, for example, silicon dioxide ($SiO_2$) or phosphosilicate glass (PSG).

Figure 1C:
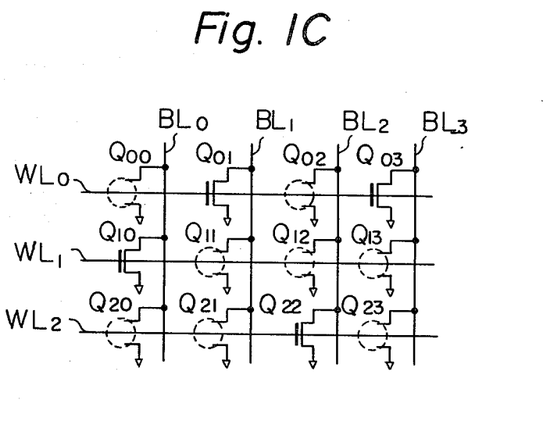
FIGS. 1C, 2C, 3C and 4C are equivalent circuit diagrams of the devices of FIGS. 1A, 2A, 3A and 4A, respectively.

FIG. 1C is an equivalent circuit diagram of the device of FIG. 1A. In FIG. 1C, for example, the data stored in the cells $Q_{00}$, $Q_{02}$, $Q_{11}$, $Q_{12}$, $Q_{13}$, $Q_{20}$, $Q_{21}$ and $Q_{23}$, in which no transistors are formed, is "0", while the data stored in the cells $Q_{01}$, $Q_{03}$, $Q_{10}$ and $Q_{22}$, in which transistors are formed, is "1". If the word line $WL_0$ is selected so that the potential thereof reaches high, the transistors of the cells $Q_{01}$ and $Q_{03}$ are turned on. As a result, the potentials of the bit lines $BL_1$ and $BL_3$ become low ($V_{ss}$); however, the potentials of the bit lines $BL_0$ and $BL_2$ remain high ($V_{DD}$). Note that all the bit lines are connected through loads to a high power supply $V_{DD}$ (not shown). The potentials of the bit lines $BL_0$ through $BL_3$ represent the data 0101.

Figure 2A:
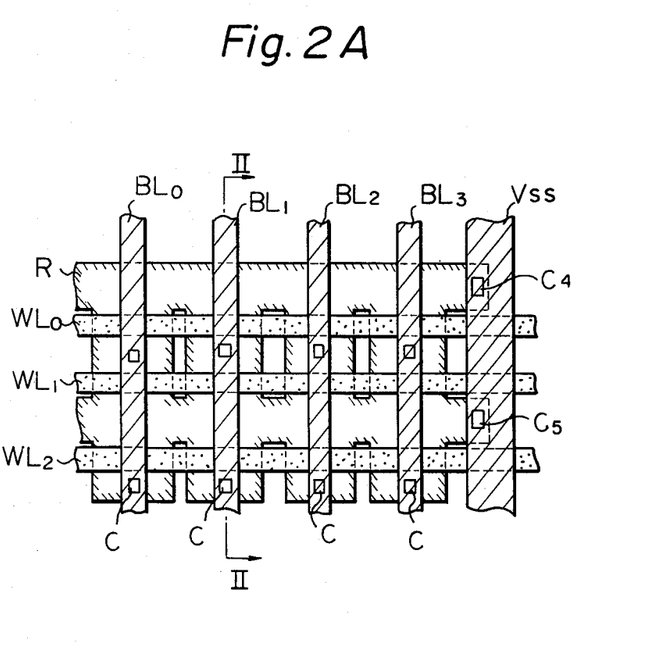

FIG. 2A is a plan view illustrating a second conventional ROM device made by using the Ci-A system. In FIG. 2A, the elements which are the same as those of FIG. 1A are denoted by the same references. In FIG. 2A, regardless of the data pattern, an <F> mask for defining an n+ type impurity region R and an <N> mask for defining contact windows C including the contact windows $C_4$ and $C_5$ are definite. In FIG. 2A, the data pattern is determined by a <C> mask for defining the areas which receive ion-implantation by using boron ions. In this case, thin oxide layers are arranged between the word lines $WL_0$, $WL_1$, $WL_2$ and the substrate 1 and in addition, the quantity of implanted ions beneath the thin oxide layers are alternative; accordingly, the threshold voltage of an enhancement transistor at each intersection between the word lines $WL_0$, $WL_1$ and $WL_2$ and the bit lines $BL_0$, $BL_1$, $BL_2$ and $BL_3$ is alternatively high or low.

Figure 2B:
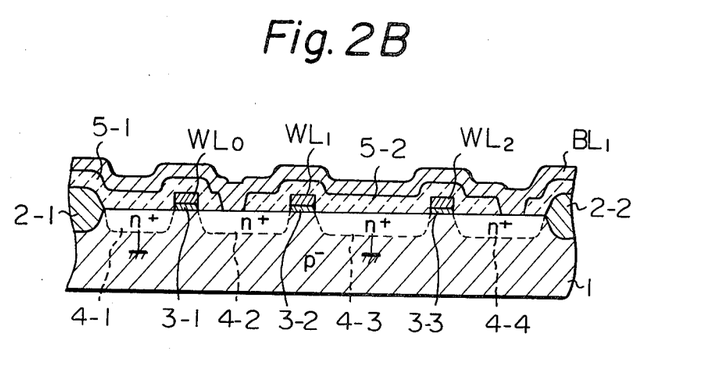

FIG. 2B is a cross-sectional view taken along the lines II—II of FIG. 2A. As illustrated in FIG. 2B, a large quantity of boron ions are implanted into the areas beneath the word lines $WL_1$ and $WL_2$. As a result, the threshold voltages of the transistors formed by the word lines $WL_1$ and $WL_2$ are considerably high, while the threshold voltage of the transistor formed by the word line $WL_0$ is low.

Figure 2C:
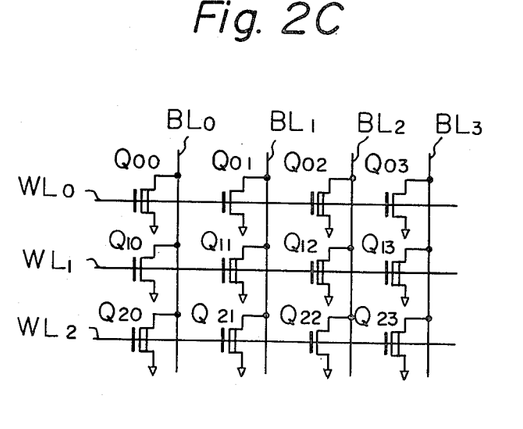

FIG. 2C is an equivalent circuit diagram of the device of FIG. 2A. In FIG. 2C, each of the cells $Q_{00}$, $Q_{02}$, $Q_{11}$, $Q_{12}$, $Q_{13}$, $Q_{20}$, $Q_{21}$ and $Q_{23}$ comprises an enhancement type transistor having a considerably high threshold voltage, while each of the cells $Q_{01}$, $Q_{03}$, $Q_{10}$ and $Q_{22}$ comprises an enhancement type transistor having a low threshold voltage. In this case, the transistor in each of the cells $Q_{00}$, $Q_{02}$, $Q_{11}$, $Q_{12}$, $Q_{13}$, $Q_{20}$, $Q_{21}$ and $Q_{23}$ is never turned on, even when the potential of one of the word lines is high, which means that transistors are substantially not formed in these cells. Therefore, the read operation of the equivalent circuit of FIG. 2C is the same as that of FIG. 1C.

Figure 3A:
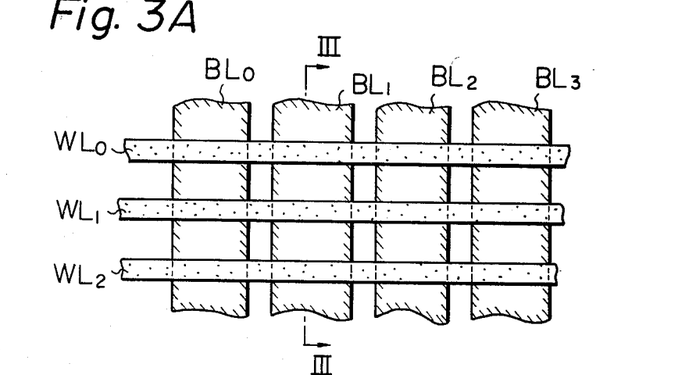

FIG. 3A is a plan view illustrating a third conventional ROM device made by using the Ci-B system. In FIG. 3A, the word lines $WL_0$, $WL_1$ and $WL_2$ are made of polycrystalline silicon; however, the bit lines $BL_0$, $BL_1$, $BL_2$ and $BL_3$ are formed by n+ type impurity regions. In FIG. 3A, the data pattern also is determined by the <Ci> mask for defining the areas which receive ion-implantation. In this case, the ion-implantation uses phosphorus ions. Therefore, an enhancement type transistor or a depletion type transistor is formed at each intersection between the word lines $WL_0$, $WL_1$ and $WL_2$ and the bit lines $BL_0$, $BL_1$, $BL_2$ and $BL_3$.

Figure 3B:
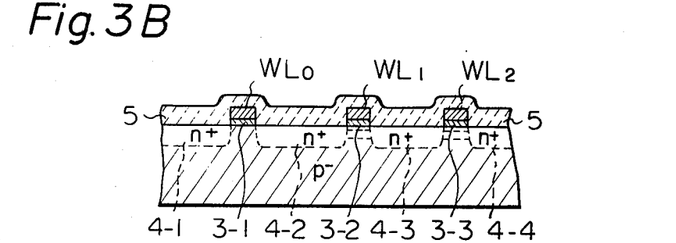

FIG. 3B is a cross-sectional view taken along the lines III—III of FIG. 3A. As illustrated in FIG. 3B, a large quantity of phosphorus ions are implanted in the areas beneath the word lines $WL_1$ and $WL_2$. As a result, the threshold voltages of the transistors formed by the word lines $WL_1$ and $WL_2$ become lower than zero; accordingly, such transistors are of a depletion type. On the other hand, the transistor formed by the word line $WL_0$ remains at a positive low level; that is, the transistor is of an enhancement type.

Figure 3C:
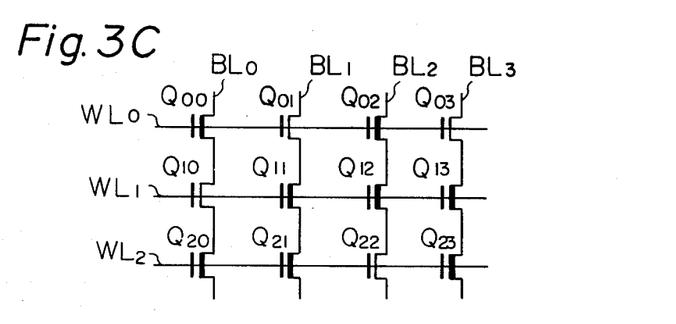

FIG. 3C is an equivalent circuit diagram of the device of FIG. 3A. In FIG. 3C, each of the cells $Q_{00}$, $Q_{02}$, $Q_{11}$, $Q_{12}$, $Q_{13}$, $Q_{20}$, $Q_{21}$ and $Q_{23}$ comprises a depletion type transistor which represents the data "0", while each of the cells $Q_{01}$, $Q_{03}$, $Q_{10}$ and $Q_{22}$ comprises an enhancement type transistor which represents the data "1".

The read operation of the circuit of FIG. 3C will be explained. For example, the selection of the word line $WL_0$ is performed by forcing the potential of the word line $WL_0$ to be low and forcing the potentials of the word lines $WL_1$ and $WL_2$ to be high. As a result, the transistors $Q_{10}$ through $Q_{13}$ and $Q_{20}$ through $Q_{23}$ are all conductive, regardless of the transistor type. On the other hand, with regard to the word line $WL_0$, the transistor $Q_{00}$ and $Q_{02}$ of a depletion type are conductive, while the transistors $Q_{01}$ and $Q_{03}$ of an enhancement type are non-conductive. Therefore, currents flow through the bit lines $BL_0$ and $BL_2$, while no currents flow through the bit lines $BL_1$ and $BL_3$. Such currents represent the data 0101.

Figure 4A:
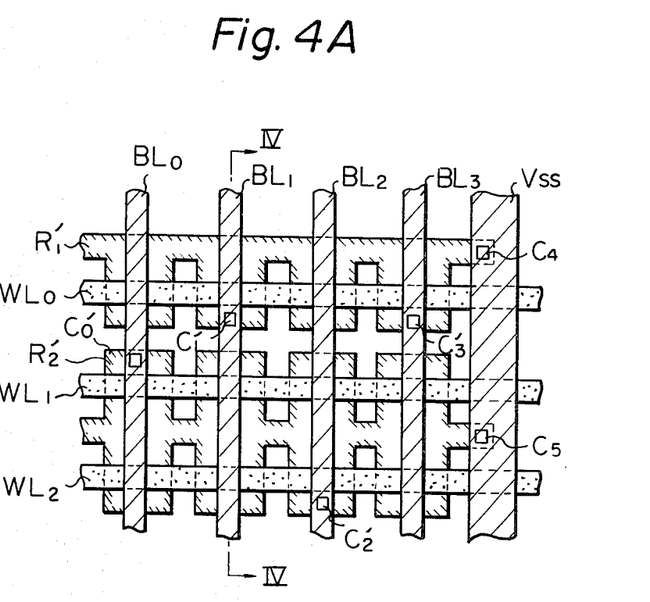

FIG. 4A is a plan view illustrating a fourth conventional ROM device made by using the N system. In FIG. 4A, the elements which are the same as those of FIGS. 1A and 2A are denoted by the same references. In FIG. 4A, regardless of the data pattern, an <F> mask for defining n+ type impurity regions $R_1'$ and $R_2'$ is definite and in addition, a <Ci> mask for defining the areas which receive ion-implantation is definite. In FIG. 4A, the data pattern is determined by only an <N> mask for defining contact windows $C_0'$, $C_1'$, $C_2'$, $C_3'$ which connect the bit lines $BL_0$, $BL_1$, $BL_2$, $BL_3$ to the impurity regions $R_1'$ and $R_2'$. In this case, the presence or absence of a contact window represents the data "0" or "1".

Figure 4B:
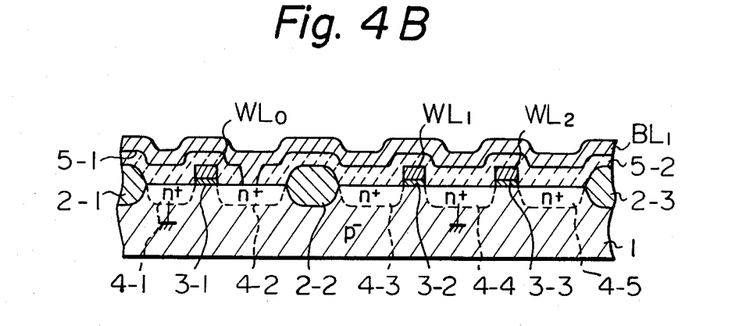

FIG. 4B is a cross-sectional view taken along the line IV—IV of FIG. 4A. In FIG. 4B, the impurity regions 4-1 and 4-2 serve a source and a drain of a first transistor formed by the word line $WL_0$, the impurity regions 4-3 and 4-4 serve as a drain and a source of a second transistor formed by the word line $WL_1$, and the impurity regions 4-4 and 4-5 serve as a source and a drain of a third transistor formed by the word line $WL_2$. Note that the bit line $BL_1$ is connected to the drain of the first transistor indicated by the impurity region 4-2. Therefore, only the first transistor is turned on and off, while the second and third transistors are always substantially non-conductive. In this case, the first, second and third transistors correspond to the data "1", "0" and "0", respectively.

Figure 4C:
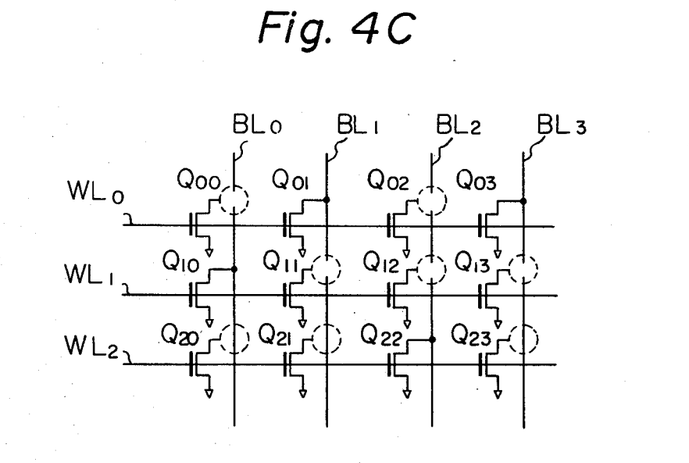

FIG. 4C is an equivalent circuit diagram of the device of FIG. 4A. In FIG. 4C, no contact window, that is, no connection for connecting a drain to a bit line is located in each of the cells $Q_{00}$, $Q_{02}$, $Q_{11}$, $Q_{12}$, $Q_{13}$, $Q_{20}$, $Q_{21}$ and $Q_{23}$ in which the data "0" is stored. On the other hand, a connection for connecting a drain to a bit line is located in each of the cells $Q_{01}$, $Q_{03}$, $Q_{10}$ and $Q_{22}$ in which the data "1" is stored. The read operation of the circuit of FIG. 4C is the same as that of FIG. 1C or 2C.

As is understood from FIGS. 1A, 2A, 3A and 4A, the F, Ci-A and C-B systems have an advantage in that the cell area is small, while the N system has a disadvantage in that the cell area is large. This is because, in the former systems, a drain area can be common to two cells; in the latter system, a drain area is provided only for one cell. Of course, in any system, a source area is common to a plurality of cells along word lines.

Next, the turn-around time for the F, Ci-A, Ci-B and N systems will be explained. The turn-around time is dependent upon the position of a masking step for determining the data pattern during the manufacturing steps thereof.

Figure 5:
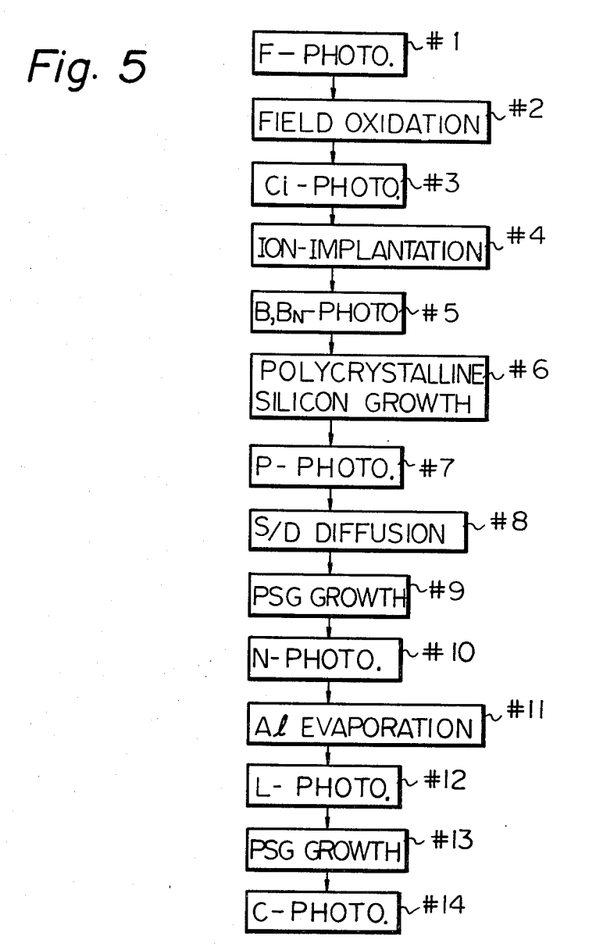
FIG. 5 is a flow diagram illustrating the manufacturing steps of the ROM devices of FIGS. 1A, 2A, 3A and 4A.

FIG. 5 is a flow diagram illustrating the manufacturing steps of the ROM devices of FIGS. 1A, 2A, 3A and 4A. In step #1, an F-photolithography process is performed by using an <F> mask for defining impurity regions, in more detail, defining active areas and field areas. In this case, silicon nitride ($SiN_4$) is deposited on the active areas. According to the F system, in this step, the data pattern is determined.

In step #2, field oxidization ($SiO_2$) is formed in the field areas by thermally oxidizing the surface of a silicon substrate with a mask of the silicon nitride. In this case, the field oxidization is about 5000 Å thick. After that the silicon nitride is removed.

In step #3, a Ci photolithography process is performed by using a <Ci> mask for defining the areas which receive ion-implantation. The areas correspond to transistor gate portions of the active areas. According to the Ci-A and Ci-B system, in this step, the data pattern is determined. In the Ci-A system, the <Ci> mask is used for forming transistors of an enhancement type having a considerably high threshold voltage, while in the Ci-B system, the <Ci> mask is used for forming transistors of a depletion type. Next, in step #4, ion-implantation is performed. In this case, for example, boron ions and phosphorus ions are used in the Ci-A and Ci-B systems, respectively.

In step #5, a B, $B_N$ photolithography process is performed by using <B> and <$B_N$> masks for defining contact windows for connecting a gate of a transistor to its source or drain. In this case, the transistor serves as a load; however, such as transistor is not shown in any figures.

In step #6, polycrystalline silicon is deposited by using chemical vapor deposition (CVD). After that, in step #7, P-photolithography process for the polycrystalline silicon is performed by using a <P> mask for defining the word lines and the like.

In step #8, impurities are diffused into regions of the substrate with a mask of the polycrystalline silicon and the field oxidation, so that the regions form a source or drain region. In the case where the substrate is a p-type, the impurities are an n-type.

Next, in step #9, PSG is deposited for electrically isolating the area between two electrical conductors such as polycrystalline silicon and aluminium.

In step #10, N-photolithography is performed by using an <N> mask for defining contact windows which connect the bit lines, which will be formed in the next step #11, to the drains of transistors. According to the N system, in this step, the data pattern is determined by the <N> mask.

In step #11, aluminium is evaporated. Next, in step #12, an L-photolithography process is performed by using an <L> mask for defining the bit lines and the like.

Next, in step #13, PSG is deposited as a cover for the entire chip. In step #14, C-photolithography is performed by using a <C> mask for defining bonding pads. Thus, the manufacture of chips is completed.

As explained above, the data pattern is determined by the <F> mask, the <Ci> mask and the <N> mask in the F system, the Ci-A or Ci-B system and the N system, respectively. Since the turn-around time is dependent upon the position of a masking step for determining the data pattern, the F system requires fourteen steps, which is the longest turn-around time, and in addition, the Ci-A or Ci-B system requires twelve steps, which is a medium turn-around time. On the other hand, the N system requires only five steps, which is the shortest turn-around time. Therefore, the N system has an advantage in that the user obtains a microcomputer incorporating a desired program quickly. However, the N system has a disadvantage in that the cell area is large so that the yield is reduced and a decrease in the production cost can not be expected.

In general, in a user program, once the main program is determined, the content of the main program is not basically changed for a long time. On the other hand, constants and subroutine programs included in the main program may be changed often. Therefore, in the present invention, a plurality of the above-mentioned systems are used for a ROM device. That is, the F or Ci-A system is applied to the first information including the main program and the like, which are basically not changed for a long time. On the other hand, the N system is applied to the second information including constants and subroutine programs which may be changed often. Thus, a chip is manufactured in advance prior to the step by using the <N> mask and, after the content of the second information is determined, the manufacture of a chip proceeds. As a result, the turn-around time according to the present invention is the same as the turn-around time by using the N system; the turn-around time is the shortest. In addition, since the portion of a ROM device is manufactured by the F or Ci-A system, which has an advantage in that the cell area is small, the area of the entire ROM device is also reduced.

The reason why the F or Ci-A system is combined with the N system is that these systems have a common point in that transistors of memory cells are connected in parallel to bit lines, so that the read operations for these systems are the same as each other. Contrary to the above, in the Ci-B system, transistors of memory cells are connected in series to bit lines; accordingly, it is difficult for the Ci-B system to exist jointly with the other systems.

Figure 6A:
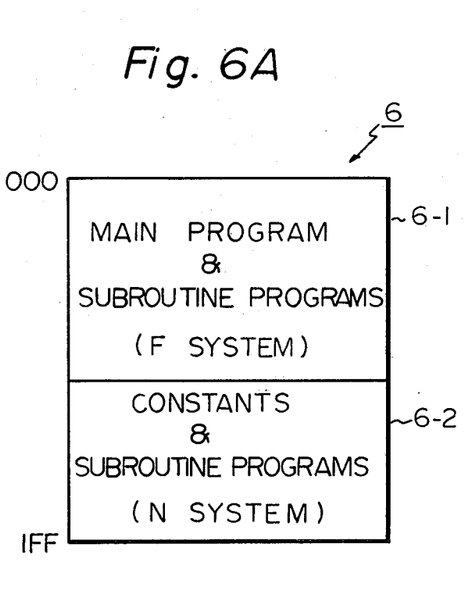
FIGS. 6A and 6B are diagrams illustrating first and second embodiments of the ROM device according to the present invention.
Figure 6B:
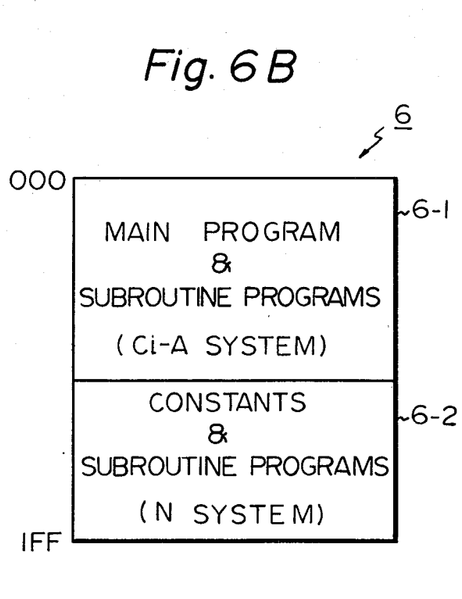

FIGS. 6A and 6B are diagrams illustrating first and second embodiments of the ROM device according to the present invention. In FIGS. 6A and 6B, 6 is a ROM device; 6-1 is a first memory cell area of the ROM device 6; and 6-2 is a second memory cell area of the ROM device 6. In the ROM device 6, a plurality of bit lines (not shown) are arranged throughout the areas 6-1 and 6-2, while a plurality of word lines (not shown) are arranged crossed with the bit lines. If the ROM device 6 consists of 4 kbits, addresses 000, 001, ..., 1FF (hexadecimal) are allocated to each word line. In this case, the smaller addresses define the first memory cell area 6-1, while the larger addresses define the second memory cell area 6-2.

A main program and subroutine programs which are not changed for a long time are written into the first area 6-1 by using the F system of the Ci-A system. On the other hand, constants and subroutine processes which may be changed often are written into the second area 6-2 by using the N system.

For example, if a main program $y=ax^2+bx+c$ is written into the first area 6-1, the constants a, b and c are written into the second area 6-2. In this case, the main program $y=ax^2+bx+c$ is not changed for a long time, while the values of the constants a, b and c may be changed often according to circumstances.

Usually, the manufacture of ROM devices proceeds to the step prior to the step of the N photolithography process, so that a large number of incomplete ROM devices are prepared. In this state, when the user determines the contents of the constants a, b and c, the manufacture of such incomplete ROM devices proceeds so that the constants a, b and c are written in the second memory cell area 6-2. As a result, the period (turn-around time) from the time when the user gives final instructions with regard to the manufacture of ROM devices to the time when the user obtains such completed ROM devices is remarkably reduced. In addition, since the F or Ci-A system is applied to the first memory cell area 6-1, the chip area thereof is reduced.

Figure 7:
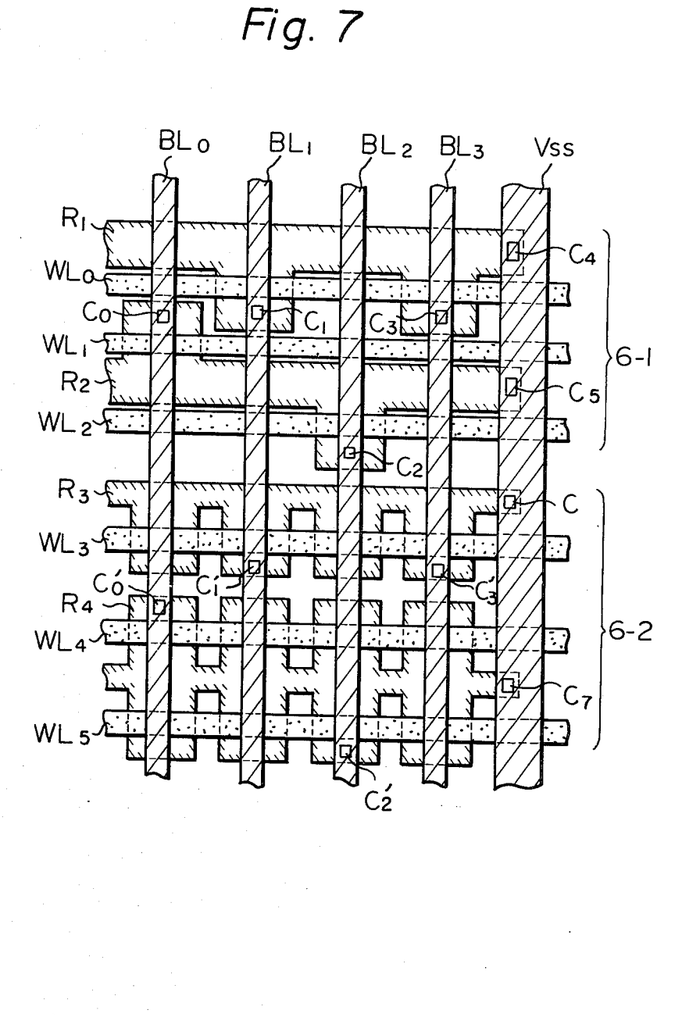
FIG. 7 is a plan view of the ROM device of FIG. 6A.
Figure 8:
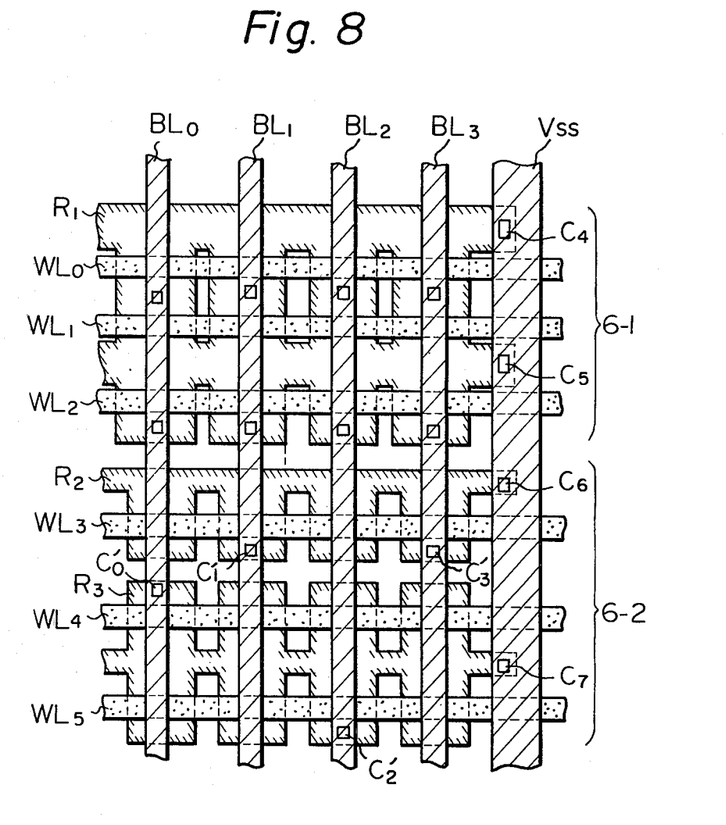
FIG. 8 is a plan view of the ROM device of FIG. 6B.

FIGS. 7 and 8 are plan views of the ROM device of FIGS. 6A and 6B, respectively. As illustrated in FIGS. 7 and 8, the memory cell area 6-1 comprises memory cells at intersections between the word lines $WL_0$, $WL_1$ and $WL_2$ and the bit lines $BL_0$, $BL_1$, $BL_2$ and $BL_3$, while the memory cell area 6-2 comprises memory cells at intersections between the word lines $WL_3$, $WL_4$ and $WL_5$ and the bit lines $BL_0$, $BL_1$, $BL_2$ and $BL_3$. Note that the bit lines $BL_0$, $BL_1$, $BL_2$ and $BL_3$ are arranged throughout both areas 6-1 and 6-2.

As explained hereinbefore, the ROM device according to the present invention has an advantage in that the chip area is reduced without increasing the turn-around time, since the turn-around time is the same as the shortest time in the conventional devices and in addition, the system having a small chip area is applied to the portion of the ROM device.

What is claimed is:

1. A read-only memory device, for storing binary data having first and second level signals, comprising:
   first and second power supplies;
   a plurality of first word lines;
   a plurality of second word lines;
   a plurality of bit lines crossed with said first word lines and said second word lines and operatively connected to said first power supply;
   a first memory cell area comprising first memory cells at intersections between said first word lines and said bit lines, each first memory cell having a first transistor in dependence upon the first and second level signals of the binary data, each first memory cell present being operatively connected between a respective one of said first word lines and said bit line and to said second power supply, wherein the presence or absence of said first transistor represents a one of the first or second level signals of said binary data, respectively; and
   a second memory cell area comprising second memory cells at intersections between said second word lines and said bit lines, each second memory cell having a second transistor operatively connected to a respective one of said second word lines and to said second power supply, wherein the presence or absence of a connection for connecting said second transistor to one of said bit lines represents a one of the first or second level signals of the binary data, respectively.

2. A device as set forth in claim 1, wherein the presence and absence of each said first transistor are determined by the low and high levels of threshold voltages of each said first transistor, respectively.

3. A device as set forth in claim 1, wherein each said first transistor has a gate operatively connected to one of said first word lines, a drain connected to one of said bit lines and a source operatively connected to said second power supply.

4. A device as set forth in claim 1, wherein each said second transistor has a drain, a gate operatively connected to one of said second word lines and a source operatively connected to said second power supply, wherein the presence or absence of a connection for connecting the drain to one of said bit lines represents the first or second level signals of the binary data.

5. A device as set forth in claim 1, wherein a first information, which is basically not changed, is written into said first memory cell area, while a second information, which may be changed often, is written into said second memory cell area.

6. A read only memory device for storing predetermined binary data having first and second signals, comprising:
   first and second word lines;
   a bit line crossing said first and second word lines;
   a first memory cell area positioned at the intersection of said first word line and said bit line, including:
      a first transistor, operatively connected between said first word line and said bit line, having first a threshold value in dependence upon the first signal; and
      a second transistor, operatively connected between said word line and said bit line, having a second threshold value in dependence upon the second signal; and
   a second memory cell area positioned at the intersection of said second word line and said bit line, including:
      a third transistor operatively connected to said second word line and operatively connected to said bit line in dependence upon the first signal; and a fourth transistor operatively connected to said second word line and operatively connected to said bit line in dependence upon the second signal.

7. A read only memory device as set forth in claim 6, wherein said first and second transistors each have an oxide layer and said first and second threshold values being determined by the thickness of each of said oxide layers.

8. A read only memory device as set forth in claim 6, wherein said first and second transistors each have an oxide layer containing boron ions and said first and second threshold values being determined by the quantity of boron ions.

9. A read only memory device as set forth in claim 6, wherein said third and fourth transistors each have a contact window, operatively connecting said bit line, in dependence upon the first and second signals, respectively.

* * * * *

UNITED STATES PATENT AND TRADEMARK OFFICE
CERTIFICATE OF CORRECTION

PATENT NO. : 4,384,345

DATED : May 17, 1983

INVENTOR(S) : KOICHI MIKOMI

It is certified that error appears in the above-identified patent and that said Letters Patent is hereby corrected as shown below:

Column 2, line 2, "include" should be --including--;
line 3, "lines and" should be --lines,--;
line 4, after "of", insert --second word lines and a plurality of--.

Column 3, line 18, "an" should be --and--;
line 46, "<C>" should be --<Ci>--.

Column 5, line 22, "C-B" should be --Ci-B--.

Column 6, line 40, "can not" should be --cannot--.

Signed and Sealed this

Twenty-second Day of November 1983

[SEAL]

Attest:

GERALD J. MOSSINGHOFF

Attesting Officer       Commissioner of Patents and Trademarks